(12) United States Patent
Rangarajan et al.

(10) Patent No.: US 6,746,822 B1
(45) Date of Patent: Jun. 8, 2004

(54) USE OF SURFACE COUPLING AGENT TO IMPROVE ADHESION

(75) Inventors: Bharath Rangarajan, Santa Clara, CA (US); Michael K. Templeton, Atherton, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 131 days.

(21) Appl. No.: 10/050,484

(22) Filed: Jan. 16, 2002

Related U.S. Application Data

(63) Continuation-in-part of application No. 09/565,691, filed on May 1, 2000.

(51) Int. Cl.[7] .............................. G03F 7/20; G03F 7/30
(52) U.S. Cl. ..................... 430/311; 430/327; 430/329
(58) Field of Search .......................... 430/311, 319, 430/327–329; 134/1.3

(56) References Cited

U.S. PATENT DOCUMENTS

| | | | | |
|---|---|---|---|---|
| 3,676,401 A | * | 7/1972 | Henry | 524/176 |
| 3,811,931 A | * | 5/1974 | Guillet | 428/35.8 |
| 5,563,238 A | * | 10/1996 | Bonsignore et al. | 528/354 |
| 5,604,073 A | * | 2/1997 | Krounbi et al. | 430/14 |

* cited by examiner

*Primary Examiner*—Mark F. Huff
*Assistant Examiner*—J. Ruggles
(74) *Attorney, Agent, or Firm*—Amin & Turocy, LLP

(57) ABSTRACT

Disclosed are methods of processing a semiconductor structure, involving the steps of depositing a light-degradable surface coupling agent on a semiconductor substrate; depositing a resist over the light-degradable surface coupling agent; irradiating portions of the resist, wherein the light-degradable surface coupling agent under the irradiated portions of the resist at least partially decomposes; and developing the resist.

22 Claims, 3 Drawing Sheets

USE OF SURFACE COUPLING AGENT TO IMPROVE ADHESION

This is a continuation-in-part of application Ser. No. 09/565,691 filed May 1, 2000.

TECHNICAL FIELD

The present invention generally relates to processing a resist on a semiconductor substrate. In particular, the present invention relates to a light-degradable surface coupling agent positioned between a semiconductor substrate and a resist, and associated methods and systems.

BACKGROUND ART

Microlithography processes for making miniaturized electronic components, such as in the fabrication of computer chips and integrated circuits, involve using photoresists. Generally, a coating or film of a photoresist is applied to a substrate material, such as a silicon wafer used for making integrated circuits. The substrate may contain any number of layers or devices thereon. In some instances, photoresists do not strongly adhere the semiconductor substrate surfaces. When photoresists do not adhere adequately to the substrate surface, undercutting and poor resolution typically result. Surface priming agents are therefore applied to a substrate just before a photoresist is applied to the substrate. Surface priming agents serve to increase adhesion between the substrate surface and the photoresist, especially organic photoresists.

The photoresist coated substrate is baked to evaporate any solvent in the photoresist composition and to fix the photoresist coating onto the substrate. The baked coated surface of the substrate is next subjected to selective radiation; that is, an image-wise exposure to radiation. This radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist. Many developer solutions contain water and a base, such as water and a hydroxide compound.

Development is a critical step in photolithography. This is because poor development decreases resolution, precise pattern formation and/or the quality of subsequent processing steps. For example, incomplete development followed by an etching step results in an incompletely etched underlayer, which in the case of an incompletely etched metal layer, may lead to short circuits. Poor development is caused by a number of factors. One factor is that a photoresist residue or a surface priming agent residue is frequently left by developer solutions. It is difficult to completely remove the photoresist residue and/or surface priming agent residue without deleteriously effecting the remaining patterned photoresist on the developed substrate surface.

In other words, the beneficial effects of surface priming agents (increased adhesion between a photoresist and a substrate) are diametrically opposed to the beneficial effects of not employing surface priming agents (easy removal of exposed portions of the photoresist during development). As a result, compromises must be made when conducting lithography.

SUMMARY OF THE INVENTION

The present invention provides a light-degradable surface coupling agent to simultaneously increase adhesion between a resist and an underlying substrate and promote removal of light exposed regions of the resist from the substrate during development, and associated methods and systems. Heretofore, improvements in adhesion between a resist and an underlying substrate result in difficulties in completely removing selected portions of the resist from the substrate during development. Similarly, improvements in easily removing selected portions of the resist from the underlying substrate during development result in decreased adhesion between the resist and the substrate. Therefore, the present invention contributes to improving lithography processing, which in turn, results in improvements in semiconductor device fabrication.

One aspect of the present invention relates to a semiconductor structure, containing a semiconductor substrate; a resist over the semiconductor substrate; and a light-degradable surface coupling agent between the resist and the semiconductor substrate.

Another aspect of the present invention relates to a method of processing a semiconductor structure, involving the steps of depositing a light-degradable surface coupling agent on a semiconductor substrate; depositing a resist over the light-degradable surface coupling agent; irradiating portions of the resist, wherein the light-degradable surface coupling agent under the irradiated portions of the resist at least partially decomposes; and developing the resist.

Yet another aspect of the present invention relates to a semiconductor processing system, containing a processing chamber operable to form a light-degradable surface coupling agent layer on a substrate in the chamber, a supply of a light-degradable surface coupling agent; and a measurement system for in situ measuring a thickness of the light-degradable surface coupling agent layer being formed and for providing a measurement signal indicative of the measured thickness.

DISCLOSURE OF INVENTION

Figure 1:
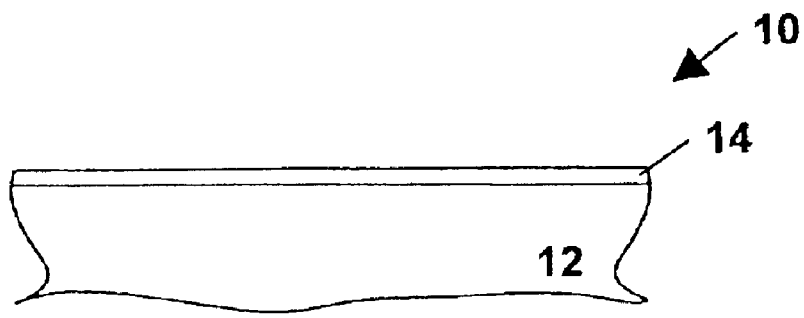
FIG. 1 illustrates a cross-sectional view of a semiconductor structure processed in accordance with one aspect of the present invention.

The present invention provides a light-degradable surface coupling agent to simultaneously achieve two effects previously thought to be inversely related. In particular, the present invention provides a light-degradable surface coupling agent to increase adhesion between a resist and an underlying substrate and promote removal of light exposed regions of the resist from the substrate during development.

The light-degradable surface coupling agent is applied to a semiconductor substrate directly or in a solvent so that it forms a thin film over the substrate. The light-degradable surface coupling agent has one surface that is relatively polar and another surface that is relatively non-polar. As a result, adhesion between a resist and an underlying substrate is increased because the relatively polar surface has a strong affinity for the semiconductor substrate/oxide layer while the relatively non-polar surface has a strong affinity for the resist deposited over the substrate.

Under the action of light, bonds are broken within the light-degradable surface coupling agent, and the light-degradable surface coupling agent ceases to function as an adhesion promoter. In other words, since the light-degradable surface coupling agent degrades upon exposure to actinic radiation, the increased adhesion between the resist and the underlying substrate is lost after selective exposure of the resist.

The light-degradable surface coupling agent, upon application to the semiconductor substrate/oxide layer before deposition of the resist, is self-orienting in that the relatively polar surface positions itself adjacent the semiconductor substrate/oxide layer, leaving the relatively non-polar surface facing outward/upward so that it is adjacent the resist after the resist is deposited. This is somewhat analogous to the action of a soap.

If applied directly, the light-degradable surface coupling agent preferably forms a very thin monolayer film over the substrate (such as a mono-molecular layer). If applied via a solvent or carrier, the light-degradable surface coupling agent preferably forms a thin film over the substrate. Regardless of how the light-degradable surface coupling agent is applied to the substrate, in one embodiment, a thin film having a thickness from about 10 Å to about 1000 Å is formed. In another embodiment, a thin film having a thickness from about 25 Å to about 750 Å is formed. In yet another embodiment, a thin film having a thickness from about 50 Å to about 500 Å is formed. In still yet another embodiment, a thin film having a thickness from about 30 Å to about 250 Å is formed.

In one embodiment, the thin film of the light-degradable surface coupling agent has a substantially uniform thickness across the substrate or portion of the substrate over which it is formed. In this connection, a substantially uniform thickness is one where the thickness of the high and low portions does not vary by more than about 30 Å.

The light-degradable surface coupling agent is typically one or more of lactic acid polymers; lactic acid copolymers; polymers and copolymers containing side chain ketone groups, such as copolymers of vinyl monomers and vinyl ketones; mixtures of polymers and organometallic compound and/or a metal salt; and functionalized siloxanes. Other compounds that function in substantially the same manner may also be employed as the light-degradable surface coupling agent.

Lactic acid polymers and lactic acid copolymers may be made from monomers of lactic acid and optionally modifying monomers such as glycols, specifically ethylene glycol and propylene glycol, p-dioxanone, 1,5-dioxepan-2-one, 1,4-oxathialan-2-one, and various mixtures and blends thereof. For example, lactic acid copolymers may be a blend of polylactic acid and polyethylene oxide. In one embodiment, the lactic acid polymers and copolymers contain from about 50% to about 100% by weight of lactic acid monomers and from about 0% to about 50% by weight of the modifying polymer. In another embodiment, the lactic acid polymers and copolymers contain from about 60% to about 98% by weight of lactic acid monomers and from about 2% to about 40% by weight of the modifying polymer.

In one embodiment, the lactic acid polymers and copolymers have molecular weights in a range of from about 5,000 to about 100,000. In another embodiment, the lactic acid polymers and copolymers have molecular weights in a range of from about 10,000 to about 75,000.

Polymers and copolymers containing side chain ketone groups can be made by incorporating a ketone into a polymer. The desired structure which is to be included in the polymer backbone is of the form:

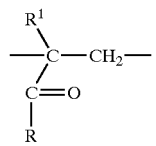

where R is an alkyl, cycloalkyl, aryl, alkenyl, or alkaryl group containing from one to about 10 carbon atoms and $R^1$ is hydrogen or an alkyl, cycloalkyl, aryl, or alkaryl group containing from one to about 7 carbon atoms. In vinyl resins, R is an alkyl or aryl group containing from one to about 9 carbon atoms and $R^1$ is hydrogen or an alkyl group containing from one to about 7 carbon atoms.

Such a structure may be introduced into the polymer chain by copolymerization, with a vinyl monomer, of a monomer of the general structure:

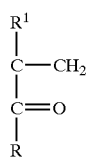

where R and $R^1$ are defined above. Examples of such monomers are methyl vinyl ketone, methyl isopropenyl ketone, ethyl vinyl ketone, propyl vinyl ketone, isopropyl vinyl ketone, buty vinyl ketone, methyl isopropenyl ketone, ethyl isopropenyl ketone, methyl isobutenyl ketone, phenyl vinyl ketone, and the like.

Although not necessary, in some instances it is preferred to distribute the ketone groups throughout the entire polymer chain and preferably at maximum distances from each other. Ketone groups, in accordance with this invention, specifically include ketonic groups, which further promote photochemical degradation of the polymer. The copolymer may be prepared by copolymerization with a vinyl monomer, or a continuous process.

The process and ketone containing light-degradable surface coupling agents include binary copolymers with a ketone co-monomer and multicomponent copolymers with other monomers. Monomers which may be used to synthesize the copolymers include ethylene, styrene, methyl acrylate, methyl methacrylate, methacrylonitrile, acrylonitrile butadiene, isoprene, vinyl acetate, vinyl chloride, acrylic acid and methacrylic acid. The methods of preparing such copolymers are within the skill of the art, and include free radical copolymerization of the mixed monomers, e.g., using peroxide catalysts, or heat generated free radicals, for initiation.

An alternative method of including the ketone group in the backbone of the polymer is to condense a polyester, polyamide, polyurethane, or similar resin including a monomer of the general structure:

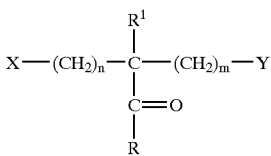

where n and m are integers from one to about 10, R and $R^1$ are as defined previously and X and Y are individually functional groups capable of condensing with the other monomers used in the polymer/resin. Typical functional groups are hydroxy (—OH), carboxyl (—COOH), ester (—COOR), amine (—$NH_2$), isocyanate, epoxy, and the like.

The simplest procedure is to prepare a pre-polymer with from about 1 to about 30 mole percent of a dibasic acid of the general structure:

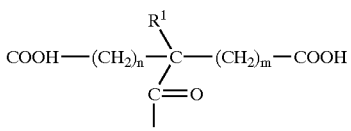

or with a diamine having the structure:

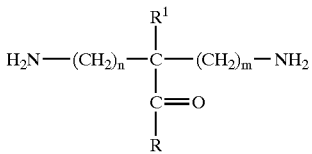

or with a glycol of the structure:

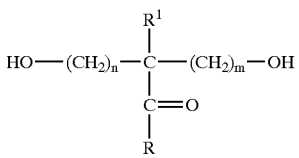

Examples of such dibasic acids are keto substituted α,ω-dibasic aliphatic acids, such as γ-acetyl pimelic acid, γ-benzoyl pimelic acid, γ-acetyl suberic acid, δ-acetyl azelaic acid and the like. These may be condensed with conventional glycols, e.g., ethylene glycol or propylene glycol, to form photodegradable polyester resins, or with conventional diamines, e.g., hexamethylene diamine and pentamethylene diamine, to form photodegradable polyamides.

Examples of such keto substituted α,ω-diamines are γ-acetyl-pentamethylene-α,ω-diamine and γ-acetyl-hexamethylene-α,ω-diamine. These can be condensation polymerised by reaction with conventional dibasic acids to form photodegradable polyamides.

Examples of such keto substituted α,ω-glycols are γ-acetyl-pentamethylene-α,ω-glycol and γ-acetyl-hexamethylene-α,ω-glycol. These can be condensation copolymerized with conventional dibasic acids, e.g., terephthalic acid, adipic acid or isophthalic acid, to form photodegradable polyester resins. Alternatively they can be condensed with dibasic isocyanates to form photodegradable polyurethanes.

The inclusion of the ketone group in the polymer chain permits the absorption of ultraviolet light, and thus copolymers containing this ketone linkage adjacent to the chain degrade quite rapidly when exposed to UV light. While not wishing to be bound by any theory, the degradation is believed to occur as a result of scission of the main chain of the polymer at the carbon atom adjacent to the carbonyl, and usually results in the formation of a double bond.

In one embodiment, the amount of ketone carbonyl included in the polymer may range from about 0.1 mole percent to about 30 mole percent. In another embodiment, the amount of ketone carbonyl included in the polymer may range from about 0.5 mole percent to about 15 mole percent. Generally speaking, higher concentrations lead to faster degradation rates. The optimum concentration can easily be calculated for a given specimen thickness using the Beer-Lambert Law of photochemistry.

Mixtures of polymers and an organometallic compound and/or a metal salt contain a polymer or copolymer containing a polyolefin and/or polyvinyl alcohol. Polyolefins and poly(vinyl alcohol) can be quite susceptible to the effects of ultraviolet light irradiation, and the effect is to cause decomposition. Homopolymers of the olefins, as well as copolymers having an olefin base, may be employed. For example, a copolymer of ethylene and from about 0.1% to about 30% carbon monoxide, homopolymers of propylene, and mixtures of ethylene and propylene homopolymers exhibit decomposition after exposure to light.

In one embodiment, organometallic compounds such as ferricine, nickelosine or the like are added to the polymer mixture to accelerate oxidation of the polymer upon exposure to light. In another embodiment, salts of iron, copper, manganese, cobalt, chromium, vanadium, nickel, zinc and other common metals are added to the polymer mixture to accelerate oxidation of the polymer upon exposure to light.

Examples of such salts include metal salts of mono or polycarboxylic acids (R'COO metal), where the carboxylic acid component (R'COO where $R^1$ is a hydrocarbon radical advantageously containing from one to about 17 carbon atoms), such as acetic acid, heptanoic acid, 2-ethylheptanoic acid, octanoic acid, myristic acid, oleic acid, stearic acid, linoleic acid, neodecanoic acid, naphthenic acid, tall oil acids, etc. Specific examples include cupric acetate, cobaltous propionate, cuprous oleate, ferric acetate, ferrous butyrate, nickel naphthenate, manganous tallate, copper oxalate, nickel sebacate, etc.

Further examples of such salts include metal acetylacetonates (metal complex of $CH_3COCH_2OCOCH_3$) and metal alkylacetoacetate (metal complex of $CH_3COCH_2COOR"$). The R" group contains from about 2 to about 20 carbon atoms and is typically one of allyl, ethyl, octyl, decyl, dodecyl, octadecyl, etc.

Still further examples of such salts include metal complexes of N,N'-salicylidene ethylene diamine, such as copper chelates and other metal chelates, and metal 8-hydroxy quinolinate, such as zinc 8-hydroxy quinolinate, etc.

Examples of additional organometallic compounds include a chromic chloride complex with stearic acid, a chromic chloride complex with oleic acid, a cobaltic chloride complex with oleic acid, and copper dust, a known pro-oxidant in polyolefins.

Functionalized siloxanes are silicon containing compounds that have a light degradable group incorporated therein. For example, ketone groups, including ketonic groups as described in connection with the polymers and copolymers containing a side chain ketone group, can be coupled or reacted with a silicon containing compound. Such reaction conditions are known by those skilled in the art or can be determined by those skilled in the art. And such ketone groups are not repeated here for brevity.

Silicon containing compounds include silane and organosilicon compounds. Organosilicon compounds include monofunctional organosilicon compounds, difunctional organosilicon compounds, and polyfunctional organosilicon compounds.

Specific examples of silicon containing compounds include silane, hexamethyldisilazane (HMDS), trimethylsilyldiethylamine (TMSDEA), trimethylsilyldimethylamine (TMSDMA), dimethylsilyldiethylamine (DMADEA), dimethylsilyldimethylamine (DMSDMA), tetramethyldisilazane (TMDS), trimethylmethoxysilane (TMMS), trimethylethoxysilane (TMES), trimethylpropoxysilane (TMPS), trimethylacetoxysilane (TMAS), bis(dimethylamino) dimethylsilane (BDMADMS), bis(dimethylamino) methylsilane (BAMS), methyldimethylaminoethoxysilane (MDAES), methyldimethoxysilane (MDMS), methyldiethyoxysilane (MDES), dimethyldimethoxysilane (DMDS), dimethyldiethoxysilane (DMES), and methyltrimethoxysilane (MTMS), and the like.

The present invention is further described in connection with FIGS. 1 to 3 generally showing a lithography process in accordance with the present invention. Referring to FIG. 1, a semiconductor structure 10 is shown wherein a light-degradable surface coupling agent, 14 is provided over a semiconductor substrate 12. The semiconductor substrate 12 is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

Specific substrate 12 surfaces over which the light-degradable surface coupling agent 14 is provided include nitride surfaces, oxide surfaces, and silicon surfaces. Nitride surfaces include silicon nitride, titanium nitride, and silicon oxynitride. Oxide surfaces include silicon dioxide; silicon oxide with a substantial amount of hydrogen (HSQ), fluorine doped silicon glass (FSG), tetraethylorthosilicate (TEOS), phosphosilicate glass (PSG), and borophosphosilicate glass (BPSG). Silicon surfaces include single crystal silicon, amorphous silicon and polysilicon.

The light-degradable surface coupling agent 14 is provided over at least a portion of the substrate 12, but typically over the entire substrate 12. The substrate 12 with the light-degradable surface,coupling agent 14 thereon may be optionally soft-baked to promote formation of a very thin film.

Figure 2:
FIG. 2 illustrates a cross-sectional view of a semiconductor structure processed in accordance with another aspect of the present invention.

Referring to FIG. 2, after the light-degradable surface coupling agent 14 is deposited on the substrate 12, an organic photoresist 16 is provided over the structure 10 (agent covered semiconductor substrate). The organic photoresist 16 is provided over at least a portion of the agent covered substrate, but typically over the entire substrate. Consequently, the light-degradable surface coupling agent 14 is positioned between the organic photoresist 16 and the semiconductor substrate 12.

Any organic photoresist 16 may be applied to the agent covered substrate surface by any suitable means. For example, a 157 nm sensitive photoresist, a 193 nm sensitive photoresist, an I-line, H-line, G-line, E-line, deep UV (such as 248 nm), extreme UV or chemically amplified photoresist material may be spin-coated on the agent covered substrate surface. Positive or negative photoresists may be used, but positive photoresists are preferred. Photoresists are commercially available from a number of sources, including Shipley Company, Kodak, Hunt, Arch Chemical, Aquamer, JSR Microelectronics, Clariant, Hoechst Celanese Corporation, Brewer and IBM. The photoresist 16 is typically applied to a thickness from about 200 Å to about 10,000 Å, although the thickness of the photoresist 16 is not critical to the invention.

Optionally after the photoresist 16 is applied to the agent covered substrate surface, the photoresist covered substrate is subjected to a soft bake to drive off excess solvent and/or to further increase adhesion with the substrate surface. The soft bake involves heating at an elevated temperature for a suitable period of time. By way of example, the photoresist covered substrate is typically heated at temperatures above about 60° C. for at least about 10 seconds.

Figure 3:
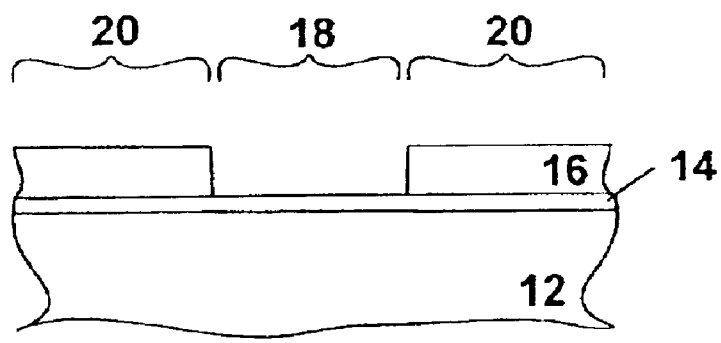
FIG. 3 illustrates a cross-sectional view of a semiconductor structure processed in accordance with yet another aspect of the present invention.

Referring to FIG. 3, the photoresist 16 is patterned. In particular, the photoresist covered substrate is selectively exposed to actinic radiation to cause a chemical transformation in desired regions of the photoresist and the corresponding underlying portions of the light-degradable surface coupling agent. The wavelength of radiation is not critical to the invention, as it depends primarily upon the identity of the photoresist material 16 and the light-degradable surface coupling agent 14. Typically, however, light having a wavelength of one or more of 11 nm, 13 nm, 157 nm, 193 nm, 248 nm, and 365 nm is employed. A mask is typically employed to selectively expose the photoresist 16 and the corresponding underlying portions of the light-degradable surface coupling agent 14.

The selectively exposed organic photoresist is developed using a suitable developer. The specific identity of the developer is not critical to the invention, but typically an aqueous alkaline solution is employed. For example, aqueous tetramethylammonium hydroxide is employed as a developer solution. In one embodiment, the aqueous developer contains a surfactant. In another embodiment the aqueous developer does not contain a surfactant since, in some instances, a surfactant in the developing solution may contribute to the formation of residue on the substrate surface.

During development, the exposed portion of the photoresist and the corresponding underlying portions of the light-degradable surface coupling agent is soluble or is solubilized in the developing solution and removed from the structure 10 leaving a trench 18 (or valley, hole, etc.). The portion 20 of the photoresist and the light-degradable surface coupling agent that is not substantially soluble in the developing solution remains on the substrate, with that portion of the photoresist securely adhered to the substrate due to the presence of the light-degradable surface coupling agent. Development results in a patterned photoresist (the remaining portion of the photoresist) over the substrate surface.

A rinsing solution is optionally contacted with the patterned photoresist covered substrate surface to remove substantially all or all of photoresist residue (soluble or partially soluble photoresist residues) and light-degradable surface coupling agent residues on the substrate surface, to neutralize the substrate surface, and to remove substantially all or all developing solution (including developing solution residues) remaining on the substrate surface. The rinsing solution contains at least water and a surfactant. Deionized water is preferred, although tap water may be employed.

As a result of the present invention, prior to development the photoresist 16 is securely adhered to the substrate 12 due to the presence of the surface coupling agent 14. However, portions 18 of the photoresist 16 are easily removed from the substrate 12 due to the light degradability of the surface coupling agent 14 while the remaining portions 20 of the photoresist 16 remain securely adhered to the substrate 12 due to the continued adhesion properties in the unexposed portions 20 of the surface coupling agent 14.

Figure 4:
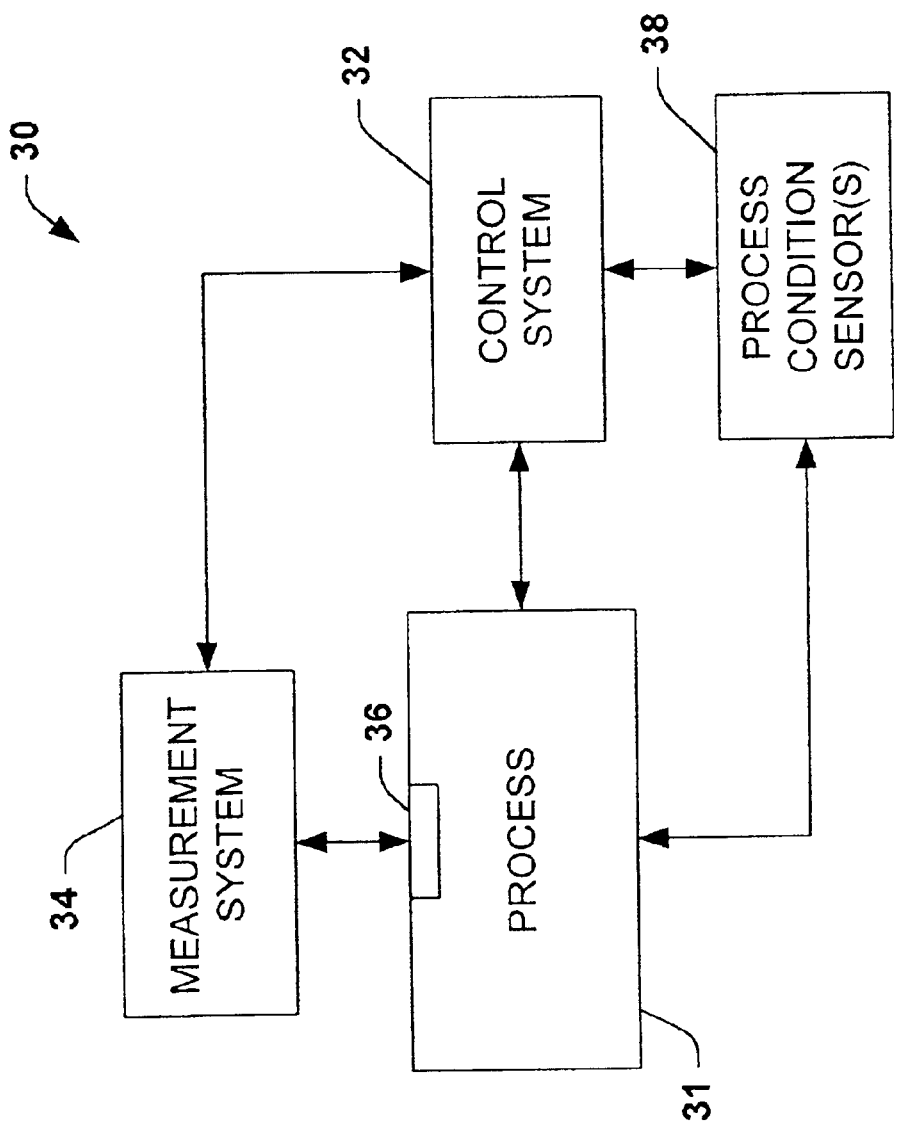
FIG. 4 is a diagrammatic block representation of a system in accordance with one aspect of the present invention.

FIG. 4 illustrates a system 30 for in-situ monitoring of the thickness of a light-degradable surface coupling agent layer or film in a semiconductor process, schematically indicated at 31. The process 31, for example, includes thin film growth and/or thin film deposition.

The system 30 also includes a control system 32 for controlling operating characteristics of the process 31. The operating characteristics associated with the process 31 may include, for example, the temperature, imposition of actinic radiation, concentration of gases within the process, pressure associated with the process, and timing parameters associated with different steps in a multi-step fabrication process. The control system 32 may adjust one or more selected operating parameters of the process based on sensed operating conditions associated with the process 31.

A measurement system 34 is operatively associated with the process 31 to measure in-situ thickness of the light-degradable surface coupling agent layer while it is being formed. That is, the measurement system 34 includes a thickness monitoring portion 36, which may be located within (or be integrated into) the process 31, such as may include an enclosed processing chamber. The measurement system 34, for example, samples the thickness of the light-degradable surface coupling agent layer being formed on the substrate at one or more locations, such as near the center and near one or more edge locations of the substrate. In particular, it may be desirable to obtain measurements from two or more spaced apart locations, such as at the center and one or more edge positions. Such measurements may enable a better determination as to uniformity of the thickness, which in accordance with an aspect of the present invention, may be employed to adjust the fabrication process to achieve a desired level of uniformity of thickness.

The measurement system 34 may implement any known technique operable to measure the thickness of the thin film being formed in the process 31. Examples of techniques that may be utilized in accordance with an aspect of the present invention include scatterometry, ellipsometry, x-ray reflectometry, and the like.

By way of further illustration, scatterometry may be employed to extract information about a surface of a substrate upon which an incident light has been directed. One or more gratings may be located on a substrate. Such gratings may be formed on the substrate, for example, at the same stage in fabrication when alignment markers are formed thereon, such as by etching. Light reflected, and/or passed through, the one or more gratings, and/or features is collected by one or more light detecting components of the measurement system 34. It is to be appreciated that any suitable scatterometry system may be employed to carry out the present invention, and such systems are intended to fall within the scope of the claims.

Those skilled in the art will understand and appreciate other techniques that also could be employed for performing in-situ thickness measurements, all of which are contemplated as falling within the scope of the present invention. The particular technique utilized in the system 30 may further vary according the type of thin film and thickness of the film in the process 31.

The measurement system 34 is coupled to the control system 32 for providing a signal indicative of the measured thickness of the light-degradable surface coupling agent layer being formed in the process 31. The control system 32, for example, includes memory (not shown) for storing a target thickness, which may vary according to the process. For example, by examining a signal (signature) library of intensity/phase signatures, a determination can be made concerning the properties of the surface, such as the thickness of a film formed thereon. The control system 32 may be programmed and/or configured to compare the measured thickness relative to the target thickness and determine what action (if any) should be taken to drive the process 31 so that a target thickness and/or a desired level of uniformity of thickness may be achieved.

The system 30 further may include one or more other process sensors 38 for monitoring process operating conditions and providing an indication of such conditions to the control system 32. The control system 32 thus is able to adjust process operating characteristics based on the measured thickness (e.g., based on a signal from the measurement system 34) and the sensed process operating conditions (e.g., based on a signal from the other process sensors 38). In this way, the control system 32 may selectively refine the film formation process 31 to accommodate variations in sensed process conditions and measured thickness at various stages of the film formation process. For example, the control system 32 may adjust transition solvent flow rates, identity, pressure, and/or temperature, based on the conditions monitored by the measurement system 34 and the sensor(s) 38. As a result, the system 30 is capable of achieving a more precise and/or uniform thickness without an increase in process steps to refine the process.

Figure 5:
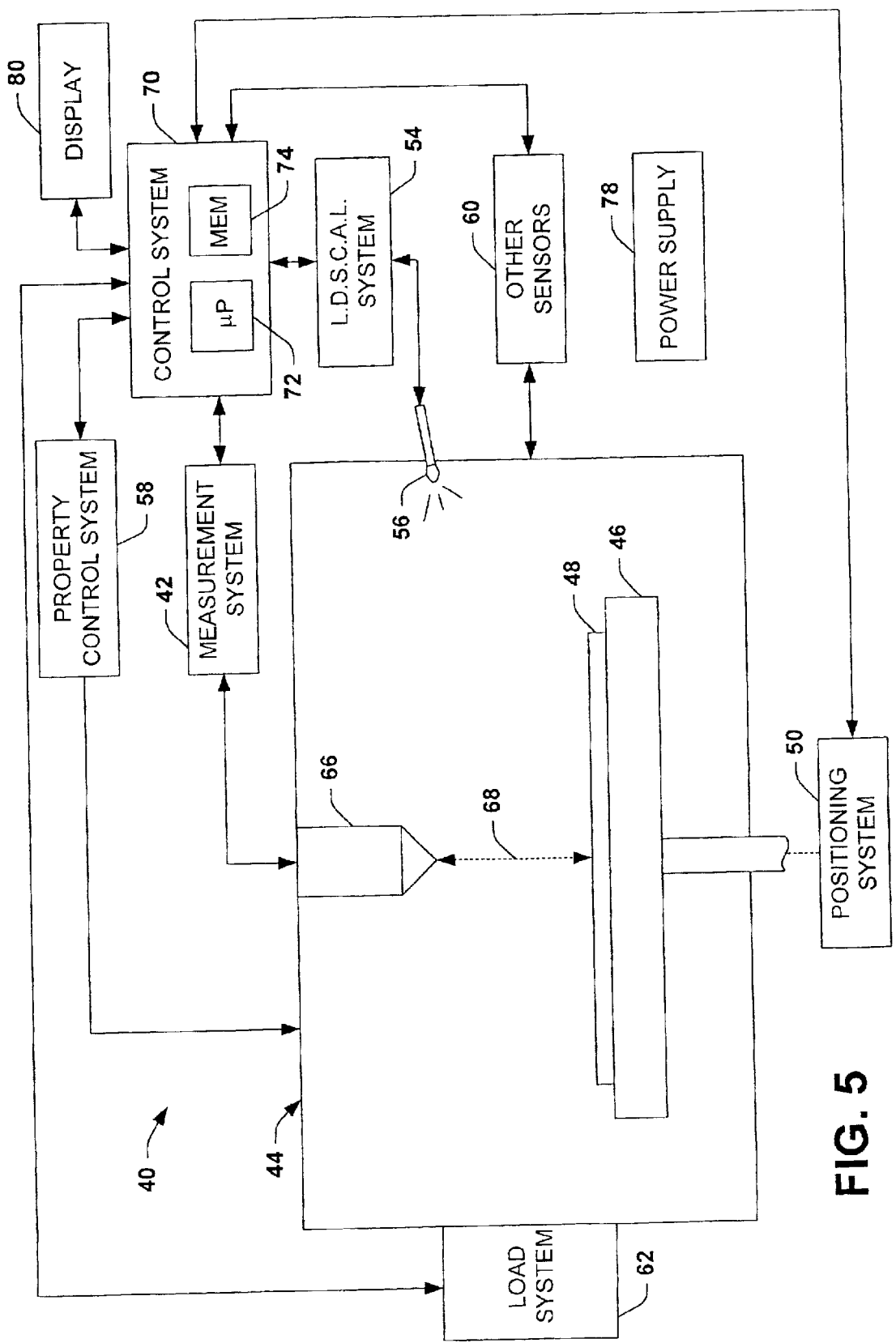
FIG. 5 is a functional block diagram of a system in accordance with another aspect of the present invention.

FIG. 5 illustrates another example of a system 40 having a measurement system 42 for in-situ thickness monitoring in accordance with an aspect of the present invention. The system 40 includes a process chamber 44 that includes a support, such as may include a stage 46 (or chuck) operative to support a substrate 48, such as a wafer. A positioning system 50 is operatively connected to the support 46 for positioning the stage 46 at a desired position within the chamber 44. It is to be appreciated that wafer positioning systems are rapidly evolving and that any such system may be employed in accordance with an aspect of the present invention.

A light-degradable surface coupling agent layer application system 54 is operably coupled to the chamber 44 for selectively providing the materials to form the thin film on the substrate 48. By way of illustration, the light-degradable surface coupling agent layer application system 54 includes a source of at least one surface coupling agent.

A property control system 58 also is provided for controlling properties within the processing chamber 44. For example, the property control system 58 controls the temperature, atmosphere (gases and/or actinic radiation and the like), pressure, and the like. The property control system 58 may implement its own control process or such control may be implemented as part of other sensors 60 operatively associated with the processing chamber 44.

The system 40 also may include a load system 62 operatively connected to the chamber 44 for loading and unloading substrates (e.g., wafers) into and out of the processing chamber. The load system 62 typically is automated to load and unload the wafers into the chamber at a controlled rate.

The measurement system 42 is operative to measure film thickness in-situ, in accordance with an aspect of the present invention. In the example illustrated in FIG. 5, the measurement system 42 is a non-destructive optical measurement system, such as may utilize one or more of scatterometry, ellipsometry, x-ray reflectometry and like techniques. The measurement system 42 typically includes a beam source and detector, schematically collectively indicated at 66. The beam source/detector 66 is located above the substrate 48. The source portion provides a light beam 68 toward an exposed surface of the substrate 48 at which the thin film is being formed. The reflected beam(s) 68, which is received at the detector portion of the source/detector 66, has beam properties (magnitude and/or phase) which may be employed to determine an indication of film thickness. A plurality of incident beams from one or more sources also may be directed at different spaced apart locations of the substrate to obtain corresponding measurements of film thickness substantially concurrently during the film formation process. The concurrent measurements, in turn, provide an indication of the uniformity of film thickness across the substrate.

For the example of optical interference, the intensity of light over a selected wavelength varies as a function of film thickness. For spectroscopic ellipsometry, thickness varies based on the state of polarization of light reflected from the film, which is functionally related to the index of refraction of the material reflecting the beam 68.

By way of further illustration, the substrate 48 has gratings formed thereon, such as may be formed concurrently with alignment markings on the substrate. The gratings, for example, may range from about 10×10 $\mu$m to about 100×100 $\mu$m, such as depending on the type of measurement tool being employed. The measurement system, in turn, may employ a scatterometry technique using spectroscopic ellipsometry to measure thickness of films being applied at the gratings. Thus, the measurement system 42 may measure properties of the wafer at opposed sides of the substrate 48 and near the center.

Using a scatterometry technique, for example, desired information concerning film thickness can be extracted by comparing the phase and/or intensity (magnitude) of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed, including film thickness.

Different combinations of the above-mentioned properties will have different effects on the phase and/or intensity of the incident light resulting in substantially unique intensity/phase signatures in the complex reflected and/or diffracted light. The measurement system 42 provides information indicative of the measured properties to a control system 70. Such information may be the raw phase and intensity information. Alternatively or additionally, the measurement system 42 may be designed to derive an indication of film thickness based on the measured optical properties and provide the control system 70 with a signal indicative of the measured film thickness according to the detected optical properties. The phase and intensity of the reflected light can be measured and plotted.

In order to determine film thickness, for example, measured signal characteristics may be compared with a signal (signature) library of intensity/phase signatures to determine properties of the surface and, in particular, concerning the film thickness. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk,$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a particular type of thin film having a first thickness may generate a first signature while the same type of film having a different thickness may generate a second signature, which is different from the first signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing, for example, over three hundred thousand phase/intensity signatures. Thus, when the phase/intensity signals are received from scatterometry detecting components, the phase/intensity signals can be pattern matched, for example, to the library of signals to determine whether the signals correspond to a stored signature. Interpolation between the two closest matching signatures further may be employed to discern a more accurate indication of thickness from the signatures in the signature library. Alternatively, artificial intelligence techniques may be employed to calculate desired parameters of the wafer under test based on the detected optical properties.

While, for purposes of simplicity of illustration, the beam shown in FIG. 5 is illustrated as being generally perpendicular relative to the substrate, it is to be appreciated that the beam 68 may be oriented at other angles relative to the substrate 48 with a corresponding detector positioned at an opposite side of the substrate for receiving the reflected beam. In addition, more than one beam may be directed toward the surface at different locations to measure thickness at such different locations and, in turn, provide a measure of uniformity of thickness across the substrate. The thickness of the film being formed at the substrate 48 thus is determined based on the optical properties (e.g., n and k) of the emitted and reflected beams 68.

The other sensors 60, for example, monitor and/or measure selected conditions in the processing environment within the chamber 44. The other sensors 60, for example, may include a temperature sensor, a mass flow sensor for gases, a pressure sensor, etc.

The various other subsystems and sensors 54, 58, 60, 62 further may provide respective signals to and/or receive control signals from the control system 70. Signals from the associated process systems 42, 54, 58, 60, 62 may indicate sensed operating conditions of the film formation process and/or operating conditions associated with the respective systems. The control system 70 in turn analyzes the conditions indicated by the received signals to discern whether the film formation process is being performed within expected operating parameters. The control system 70 also controls operating characteristics associated with the film formation process being implemented within the processing chamber 44 by providing appropriate control signals to the associated systems and/or sensors 42, 54, 58, 60, 62. Such control signals thus may adjust operating parameters of the wafer fabrication process when one or more detected parameters, including film thickness, are not within expected operating parameters (e.g., where film thickness is not uniform).

By way of example, the control system 70 includes a processor 72, such as a microprocessor or CPU, coupled to a memory 74. The processor 72 receives measured data from the measuring system 42 and corresponding other data from the other sensors 60. The processor 72 also is operatively coupled to the light-degradable surface coupling agent layer application system 54, the property control system 58, and the load station 62. The control system 70 is programmed/ and or configured to control and operate the various components within the processing system 40 in order, to carry out the various functions described herein.

The processor 72 may be any of a plurality of processors, such as the AMD K6, ATHLON or other processors. The manner in which the processor 72 can be programmed to carry out the functions relating to the present invention will be readily apparent to those having ordinary skill in the art based on the description provided herein.

The memory 74 serves, to store program code executed by the processor 72 for carrying out operating functions of the system as described herein. The memory 74 may include a read only memory (ROM) and a random access memory (RAM). The ROM contains among other code the Basic Input-Output System (BIOS) which controls the basic hardware operations of the system 40. The RAM is the main memory into which the operating system and application programs are loaded. The memory 74 also serves as a storage medium for temporarily storing information such as temperature, temperature tables, position coordinate tables, interferometry information, thickness tables, and algorithms that may be employed in carrying out the present invention. The memory 74 also can hold patterns against which observed data can be compared as well as information concerning grating sizes, grating shapes, scatterometry information, achieved profiles, desired profiles and other data that may be employed in carrying out the, present invention. For mass data storage, the memory 74 may include a bard disk drive.

A power supply 78 provides operating power to the system 20. Any suitable power supply (e.g., battery, line power) may be employed to carry out the present invention. The system further may include a display 80 operatively coupled to the control system 70 for displaying a representation (e.g., graphical and/or text) of one or more process conditions, such as film thickness, temperature, flow rates, contact time, etc. The display 80 further may show a graphical and/or textual representation of the measured optical properties (refractive index and/or absorption content) at various locations along the surface of the substrate.

As a result, the system 40 provides for monitoring process conditions, including film thickness and other sensed process-related conditions, associated with the hydrophobicity treatment process within the chamber 44. The monitored conditions provide data based on which the control system 70 may implement feedback process control so as to form a light-degradable surface coupling agent layer having a desired thickness, including a uniform thickness across the substrate.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of processing a semiconductor structure, comprising:

depositing a light-degradable surface coupling agent on a semiconductor substrate, the light-degradable surface coupling agent losing its adhesion properties upon exposure to light;

depositing a resist over the light-degradable surface coupling agent;

irradiating portions of the resist, wherein the light-degradable surface coupling agent under the irradiated portions of the resist at least partially decomposes; and developing the resist.

2. The method of claim 1, wherein the light-degradable surface coupling agent comprises one or more selected from the group consisting of lactic acid polymers, lactic acid copolymers, polymers and copolymers containing side chain ketone groups, mixtures of polymers and an organometallic compound or a metal salt, and functionalized siloxanes.

3. The method of claim 1, wherein the light-degradable surface coupling agent comprises monomers of lactic acid and optionally one or more modifying monomers selected from the group consisting of glycols, p-dioxanone, 1,5-dioxepan-2-one, and 1,4-oxathialan-2-one.

4. The method of claim 1, wherein the light-degradable surface coupling agent comprises a polymer or copolymer comprising side chain ketone groups, wherein the ketone groups are represented by the chemical structure:

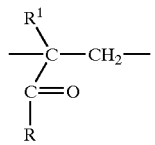

where R is an alkyl, cycloalkyl, aryl, alkenyl, or alkaryl group containing from one to about 10 carbon atoms and $R^1$ is hydrogen or an alkyl, cycloalkyl, aryl, or alkaryl group containing from one to about 7 carbon atoms.

5. The method of claim 4, wherein the polymer or copolymer comprises a polyester, a polyamide, or a polyurethane.

6. The method of claim 1, wherein the light-degradable surface coupling agent forms a thin film having a thickness from about 50 Å to about 500 Å.

7. A method of increasing adhesion between non-irradiated portions of a resist and a semiconductor substrate while improving removal of irradiated portions of the resist from the semiconductor substrate during development, comprising:

employing a light-degradable surface coupling agent having a thickness from about 10 Å to about 1,000 Å between the resist and the semiconductor substrate, the light-degradable surface coupling agent losing its adhesion properties upon exposure to light.

8. The method of claim 7, wherein the light-degradable surface coupling agent comprises one or more selected from the group consisting of lactic acid polymers, lactic acid copolymers, polymers and copolymers containing side chain ketone groups, mixtures of polymers and an organometallic compound or a metal salt, and functionalized siloxanes.

9. The method of claim 7, wherein light-degradable surface coupling agent comprises monomers of lactic acid and optionally one or more modifying monomers selected from the group consisting of glycols, p-dioxanone, 1,5-dioxepan-2-one, and 1,4-oxathialan-2-one.

10. The method of claim 7, wherein the light-degradable surface coupling agent comprises mixtures of a polymer and an organometallic compound or a metal salt, and the polymer comprises a polyolefin or a polyvinyl alcohol.

11. The method of claim 7, wherein the light-degradable surface coupling agent comprises a functionalized siloxane made by coupling a ketone group with a silicon containing compound, the ketone group represented by the chemical structure:

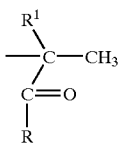

where R is an alkyl, cycloalkyl, aryl, alkenyl, or alkaryl group containing from one to about 10 carbon atoms and $R^1$ is hydrogen or an alkyl, cycloalkyl, aryl, or alkaryl group containing from one to about 7 carbon atoms, the silicon containing compound comprising at least one selected from the group consisting of silane, hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

12. A method of processing a semiconductor structure, comprising:
depositing a light-degradable surface coupling agent on a semiconductor substrate, the light-degradable surface coupling agent having a polar surface and a non-polar surface, the light-degradable surface coupling agent losing its adhesion properties upon exposure to light;
depositing a resist over the light-degradable surface coupling agent;
irradiating portions of the resist, wherein the light-degradable surface coupling agent under the irradiated portions of the resist at least partially decomposes; and
developing the resist.

13. The method of claim 12, wherein the light-degradable surface coupling agent comprises one or more selected from the group consisting of lactic acid polymers, lactic acid copolymers, polymers and copolymers containing side chain ketone groups, mixtures of polymers and an organometallic compound or a metal salt, and functionalized siloxanes.

14. The method of claim 12, wherein the light-degradable surface coupling agent comprises monomers of lactic acid and optionally one or more modifying monomers selected from the group consisting of glycols, p-dioxanone, 1,5-dioxepan-2-one, and 1,4-oxathialan-2-one.

15. The method of claim 12, wherein the light-degradable surface coupling agent comprises a polymer or copolymer comprising side chain ketone groups, wherein the ketone groups are represented by the chemical structure:

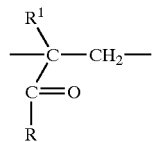

where R is an alkyl, cycloalkyl, aryl, alkenyl, or alkaryl group containing from one to about 10 carbon atoms and $R^1$ is hydrogen or an alkyl, cycloalkyl, aryl, or alkaryl group containing from one to about 7 carbon atoms.

16. The method of claim 15, wherein the polymer or copolymer comprises a polyester, a polyamide, or a polyurethane.

17. The method of claim 1, wherein the light-degradable surface coupling agent forms a thin film having a thickness from about 50 Å to about 500 Å.

18. A method of increasing adhesion between non-irradiated portions of a resist and a semiconductor substrate while improving removal of irradiated portions of the resist from the semiconductor substrate during development, comprising:
employing a light-degradable surface coupling agent having a thickness from about 10 Å to about 1,000 Å between the resist and the semiconductor substrate, the light-degradable surface coupling agent having a polar surface and a non-polar surface, the light-degradable surface coupling agent losing its adhesion properties upon exposure to light.

19. The method of claim 18, wherein the light-degradable surface coupling agent comprises one or more selected from the group consisting of lactic acid polymers, lactic acid copolymers, polymers and copolymers containing side chain ketone groups, mixtures of polymers and an organometallic compound or a metal salt, and functionalized siloxanes.

20. The method of claim 18, wherein light-degradable surface coupling agent comprises monomers of lactic acid and optionally one or more modifying monomers selected from the group consisting of glycols, p-dioxanone, 1,5-dioxepan-2-one, and 1,4-oxathialan-2-one.

21. The method of claim 18, wherein the light-degradable surface coupling agent comprises mixtures of a polymer and an organometallic compound or a metal salt, and the polymer comprises a polyolefin or a polyvinyl alcohol.

22. The method of claim 18, wherein the light-degradable surface coupling agent comprises a functionalized siloxane made by coupling a ketone group with a silicon containing compound, the ketone group represented by the chemical structure:

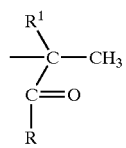

where R is an alkyl, cycloalkyl, aryl, alkenyl, or alkaryl group containing from one to about 10 carbon atoms and $R^1$ is hydrogen or an alkyl, cycloalkyl, aryl, or alkaryl group containing from one to about 7 carbon atoms, the silicon containing compound comprising at least one selected from the group consisting of silane, hexamethyldisilazane, trimethylsilyldiethylamine, trimethylsilyldimethylamine, dimethylsilyldiethylamine, dimethylsilyldimethylamine, tetramethyldisilazane, trimethylmethoxysilane, trimethylethoxysilane, trimethylpropoxysilane, trimethylacetoxysilane, bis(dimethylamino)dimethylsilane, bis(dimethylamino)methylsilane, methyldimethylaminoethoxysilane, methyldimethoxysilane, methyldiethyoxysilane, dimethyldimethoxysilane, dimethyldiethoxysilane, and methyltrimethoxysilane.

* * * * *